(12) United States Patent
Li

(10) Patent No.: US 11,430,843 B2
(45) Date of Patent: Aug. 30, 2022

(54) DISPLAY PANEL AND ELECTRONIC EQUIPMENT HAVING MICRO LIGHT-EMITTING DIODE IN TRANSPARENT DISPLAY AREA

(71) Applicant: WUHAN CHINA STAR OPTOELECTRONICS SEMICONDUCTOR DISPLAY TECHNOLOGY CO., LTD., Wuhan (CN)

(72) Inventor: Jun Li, Wuhan (CN)

( * ) Notice: Subject to any disclaimer, the term of this patent is extended or adjusted under 35 U.S.C. 154(b) by 330 days.

(21) Appl. No.: 16/631,458

(22) PCT Filed: Aug. 20, 2019

(86) PCT No.: PCT/CN2019/101499
§ 371 (c)(1),
(2) Date: Jan. 16, 2020

(87) PCT Pub. No.: WO2021/017046
PCT Pub. Date: Feb. 4, 2021

(65) Prior Publication Data
US 2021/0408144 A1    Dec. 30, 2021

(30) Foreign Application Priority Data

Jul. 31, 2019 (CN) .......................... 201910699477.6

(51) Int. Cl.
*H01L 27/32* (2006.01)
*H01L 51/52* (2006.01)

(52) U.S. Cl.
CPC ........ *H01L 27/326* (2013.01); *H01L 27/3234* (2013.01); *H01L 51/5237* (2013.01)

(58) Field of Classification Search
CPC .......................................... H04M 1/0262–0268
See application file for complete search history.

(56) References Cited

U.S. PATENT DOCUMENTS

| | | | |
|---|---|---|---|
| 2019/0013365 | A1 | 1/2019 | Lin |
| 2020/0204715 | A1* | 6/2020 | Ouyang ................ H01L 27/326 |
| 2020/0274091 | A1 | 8/2020 | Zeng |
| 2020/0312831 | A1* | 10/2020 | He .......................... H01L 25/18 |
| 2020/0312925 | A1* | 10/2020 | Xia ...................... H01L 27/3258 |

FOREIGN PATENT DOCUMENTS

| | | |
|---|---|---|
| CN | 109300951 A | 2/2019 |
| CN | 109801903 A | 5/2019 |
| CN | 109817109 A | 5/2019 |
| CN | 109859646 A | 6/2019 |
| CN | 109950281 A | 6/2019 |
| CN | 109962092 A | 7/2019 |
| CN | 110071160 A | 7/2019 |

OTHER PUBLICATIONS

Machine translation of IDS reference CN 109859646.*

* cited by examiner

*Primary Examiner* — Suberr L Chi

(57) ABSTRACT

A display panel and an electronic equipment are provided. By setting micro light-emitting diodes in a transparent display area, the transparent display area has high light transmittance and high display brightness, and a technical problem of an inferior display performance of the display panel and the electronic equipment is prevented.

15 Claims, 4 Drawing Sheets

DISPLAY PANEL AND ELECTRONIC EQUIPMENT HAVING MICRO LIGHT-EMITTING DIODE IN TRANSPARENT DISPLAY AREA

FIELD OF DISCLOSURE

The present disclosure relates to the field of display technologies, and in particular, to a display panel and an electronic equipment.

BACKGROUND

With upgrading of smartphones, a market share of mobile phones with high screen-to-body ratio is getting higher and higher. In order to improve the screen-to-body ratio, mobile phone manufacturers will try to design a sensor positioned under a screen. At present, an under-screen fingerprint recognition technology has been commercialized. Screen sounding and under-screen iris recognition technology are becoming more and more mature, which promotes a further improvement of the screen-to-body ratio. A front-facing camera has higher requirements on image quality. However, the image quality of a camera positioned under the screen is not good, which makes an implementation of the camera positioned under the screen difficult.

Currently, a screen of an organic light-emitting diode display panel is divided into an under-screen camera area and a non-under-screen camera area, and a front-facing camera is below the under-screen camera area. The non-under-screen camera area has a higher number of pixels per inch. The non-under-screen camera area accounts for a higher proportion of the screen and can display a more delicate image. The under-screen camera area has a lower number of pixels per inch and can display a simple image. Part of the under-screen camera area has no metal traces that allow light to pass through to provide light for the front-facing camera. Due to the lower number of pixels per inch of the under-screen camera area, a light-emitting area is small, resulting in lower brightness of the under-screen camera area. In order to increase the brightness of the under-screen camera area, it is necessary to increase the brightness of the under-screen camera area. As a result, a lifespan of the under-screen camera area of the organic light-emitting diode is decreased, and use it for long time will cause the brightness of the under-screen camera area to be abnormal and display poor.

Therefore, it is necessary to propose a technical solution to solve the problem that the under-screen camera area needs to ensure the light transmittance and the light-emitting brightness, resulting in poor display of the organic light-emitting diode display panel.

SUMMARY OF DISCLOSURE

An object of the present disclosure is to provide a display panel and an electronic equipment. A transparent display area of the display panel has high light transmittance and good light-emitting brightness, and a technical problem of an inferior display performance of the display panel and the electronic equipment is prevented.

A display panel includes a display area and a transparent display area outside the display area. The transparent display area includes at least one first display pixel unit which includes at least one micro light-emitting diode.

In the above display panel, the display area includes a plurality of second display pixel units which are arranged in an array, and each of the second display pixel units includes an organic light-emitting diode.

In the above display panel, the transparent display area includes a plurality of first display pixel units, and a density of the second display pixel units in the display area is greater than a density of the first display pixel units in the transparent display area.

In the above display panel, each of the first display pixel units is composed of a red micro light-emitting diode, a blue micro light-emitting diode, and a green micro light-emitting diode, and each of the second display pixel units is composed of a red organic light-emitting diode, a blue organic light-emitting diode, and a green organic light-emitting diode.

In the above display panel, a distance between any two adjacent first display pixel units is greater than a distance between any two adjacent second display pixel units.

In the above display panel, the display panel further includes an encapsulation layer formed on the second display pixel units of the display area to encapsulate the second display pixel units.

In the above display panel, the display panel further includes a thin film transistor array substrate. The thin film transistor array substrate includes a first thin film transistor in the transparent display area, and the thin film transistor array substrate includes a second thin film transistor in the display area, the first thin film transistor is correspondingly disposed and electrically connected to the micro light-emitting diode, and the second thin film transistor is correspondingly disposed and electrically connected to the organic light-emitting diode.

In the above display panel, a size of the first display pixel unit is less than or equal to a size of the second display pixel unit.

In the above display panel, a ratio of an area occupied by the first display pixel units in the transparent display area to an area of the transparent display area ranges from 2/5 to 3/5.

An electronic equipment includes a display panel, a front-facing camera, and a mainboard. The mainboard is electrically connected to the front-facing camera and the display panel, the front-facing camera is located at one side of the display panel and corresponds to a transparent display area, and the mainboard is located at a side of the front-facing camera away from the display panel, the display panel includes a display area and the transparent display area outside the display area, and the transparent display area includes at least one first display pixel unit which includes at least one micro light-emitting diode.

In the above display panel, the display area includes a plurality of second display pixel units which are arranged in an array, and each of the second display pixel units includes an organic light-emitting diode.

In the above display panel, the transparent display area includes a plurality of first display pixel units, and a density of the second display pixel units in the display area is greater than a density of the first display pixel units in the transparent display area.

In the above display panel, each of the first display pixel units is composed of a red micro light-emitting diode, a blue micro light-emitting diode, and a green micro light-emitting diode, and each of the second display pixel units is composed of a red organic light-emitting diode, a blue organic light-emitting diode, and a green organic light-emitting diode.

In the above display panel, a distance between any two adjacent first display pixel units is greater than a distance between any two adjacent second display pixel units.

In the above display panel, the display panel further includes an encapsulation layer formed on the second display pixel units of the display area to encapsulate the second display pixel units.

In the above display panel, the display panel further includes a thin film transistor array substrate. The thin film transistor array substrate includes a first thin film transistor in the transparent display area, and the thin film transistor array substrate includes a second thin film transistor in the display area, the first thin film transistor is correspondingly disposed and electrically connected to the micro light-emitting diode, and the second thin film transistor is correspondingly disposed and electrically connected to the organic light-emitting diode.

In the above display panel, a size of the first display pixel unit is less than or equal to a size of the second display pixel unit.

In the above display panel, a ratio of an area occupied by the first display pixel units in the transparent display area to an area of the transparent display area ranges from 2/5 to 3/5.

The present disclosure provides a display panel and an electronic equipment, where micro light-emitting diodes are disposed in a transparent display area for displaying, such that the transparent display area has high light transmittance and high display brightness, and a technical problem of an inferior display performance of the display panel and the electronic equipment is prevented.

DETAILED DESCRIPTION

The technical solutions in the embodiments of the present disclosure are clearly and completely described herein with reference to the drawings in the embodiments of the present disclosure. Apparently, the described embodiments represent only some and not all of the embodiments of the present disclosure. All other embodiments obtained by one of ordinary skill in the art based on the embodiments of the present disclosure fall within the scope of protection of the present disclosure.

Figure 1:
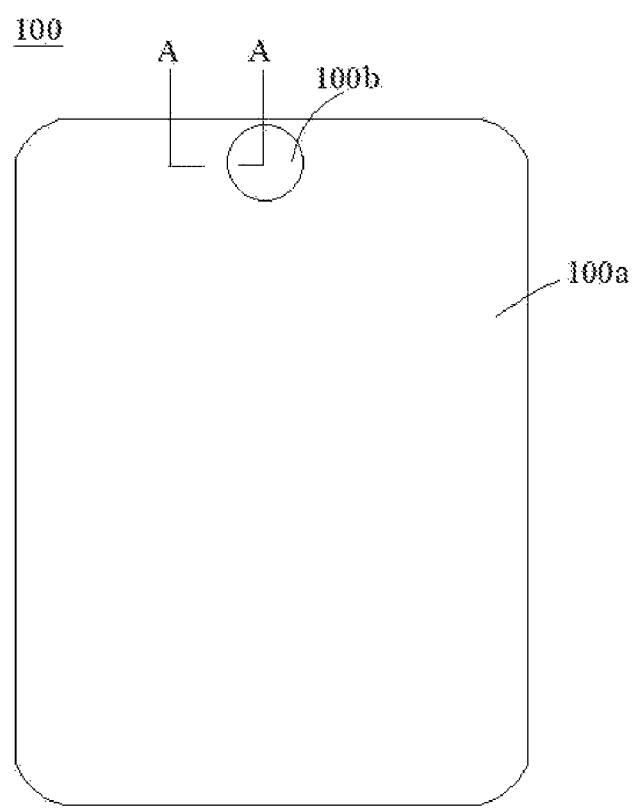
FIG. 1 is a schematic plan view of a display panel according to an embodiment of the present disclosure.

Please refer to FIG. 1, which is a schematic plan view of a display panel according to an embodiment of the present disclosure. The display panel 100 includes a display area 100*a* and a transparent display area 100*b*. The display area 100*a* is used to display images, and the transparent display area 100*b* is used to display images and also to transmit light from the outside to the outside to the display panel 100. An area of the display area 100*a* is larger than an area of the transparent display area 100*b*. The transparent display area 100*b* can be located at a middle of one side of the display panel 100, or near a peripheral edge or a corner of the display panel 100. The transparent display area 100*b* can also be located in the middle of the display panel 100. A shape of the transparent display area 100*b* may be a circle, a rectangle, or a U shape. The transparent display area 100*b* is provided with at least one first display pixel unit, and the first display pixel units include at least one micro light-emitting diode.

A luminescent material of the micro light-emitting diode is an inorganic material. The micro light-emitting diode has advantages of small size, high luminous efficiency, and long lifespan. The use of the micro light-emitting diode as a display pixel unit in the transparent display area 100*b* enables the transparent display area 100*b* to have a high light transmittance and a high display brightness. Also, the display brightness of the transparent display area 100*b* does not significantly decrease with service time of the display panel, so a technical problem of an inferior display performance of the display panel is prevented. A size of the micro light-emitting diode ranges from 5 micrometers to 50 micrometers. In general, a micro light-emitting diode is formed of a cathode, an anode, and an inorganic semiconductor layer between the cathode and the anode. A light color of the micro light-emitting diode is related to a semiconductor band gap. A blue micro light-emitting diode uses a semiconductor with a wide band gap, and a red micro light-emitting diode uses a semiconductor with a narrow band gap.

In the display panel of the embodiment of the present disclosure, micro-organic light-emitting diodes are disposed in a transparent display area for displaying, so that the transparent display area has high light transmittance and high display brightness, and a technical problem of an inferior display performance of the display panel is prevented.

Figure 2A:
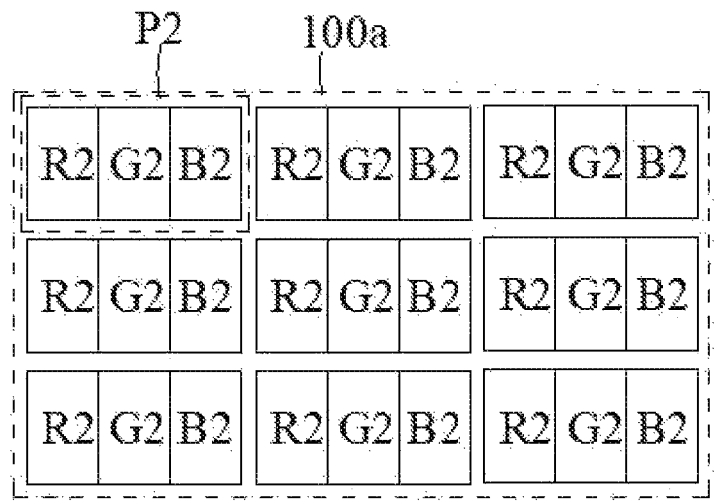
FIG. 2A is a partially enlarged schematic view showing a display area of the display panel of FIG. 1.
Figure 2B:
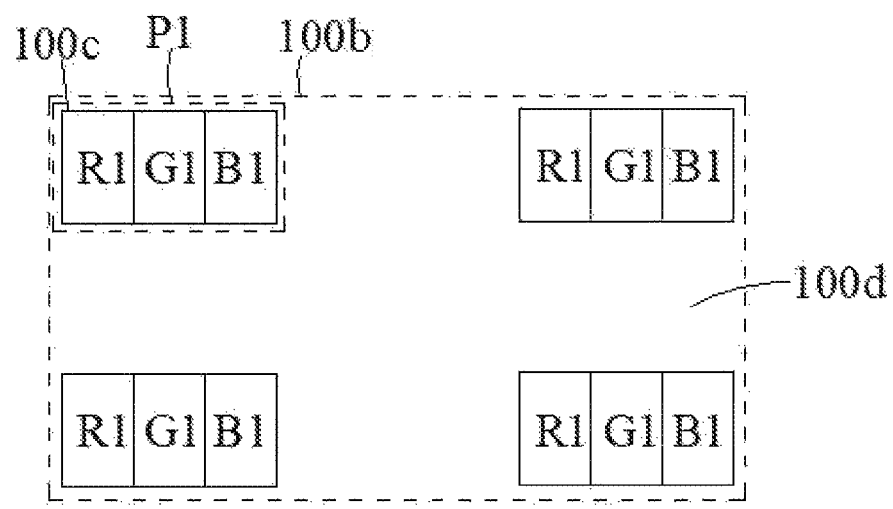
FIG. 2B is a partially enlarged schematic view showing a transparent display area of the display panel of FIG. 1.

Please refer to FIG. 2A and FIG. 2B, FIG. 2A is a partially enlarged schematic view showing a display area of the display panel of FIG. 1, and FIG. 2B is a partially enlarged schematic view showing a transparent display area of the display panel of FIG. 1. The display area 100*a* includes a plurality of second display pixel units P2 which are arranged in an array. Each of the second display pixel units P2 includes an organic light-emitting diode. The transparent display area 100*b* includes a plurality of first display pixel units P1.

In comparison with both the display area and the transparent display area are provided with the micro light-emitting diodes which serve as display units, the display panel of the present embodiment employs that the display area 100*a* is provided with the organic light-emitting diodes and the transparent display area 100*b* is provided with the micro light-emitting diodes, such that technical problems of a low transfer yield of the micro light-emitting diodes during a manufacturing process of the display panel resulting in the micro light-emitting diodes to be easily damaged, and an inferior display performance of the display panel are prevented. In comparison with both the display area and the transparent display area are provided with the organic light-emitting diodes which serve as display units, the display panel of the present embodiment can ensure that the display brightness of the transparent display area 100*b* is high, and a technical problem of an inferior display performance of the display panel is prevented In the transparent display area 100*b*, a space occupied by the first display pixel units P1 is the display area 100*c* of the transparent display area 100*b*, and gaps between any two adjacent first display pixel units P1 are the transparent area 100*d* of the transparent display area 100*b*. In order to balance a display performance and a light transmission performance of the transparent display area 100*b* of the display panel 100, a ratio of an area occupied by the first display pixel units P1 in the transparent display area 100b to an area of the transparent display area 100b ranges from 2/5 to 3/5.

A density of the second display pixel units P2 in the display area 100a is greater than a density of the first display pixel units P1 in the transparent display area 100b, so the display performance of the display area is increased and the display performance and the light transmission performance of the transparent display area 100b are increased. A size of the first display pixel unit P1 is less than or equal to a size of the second display pixel unit P2. A distance between any two adjacent first display pixel units P1 is greater than a distance between any two adjacent second display pixel units P2. Specifically, the distance between any two adjacent first display pixel units P1 is 2 to 7 times the distance between any two adjacent second display pixel units P2. For example, the distance between any two adjacent first display pixel units P1 ranges from 50 micrometers to 100 micrometers, and the distance between any two adjacent second display pixel units P2 ranges from 15 micrometers to 25 micrometers. It should be noted that the gap between the second display pixel units P2 in the display area 100a is small and will not allow light to pass through it.

In order to make images displayed by the display area 100a and the transparent display area 100b uniform, each first display pixel unit P1 is composed of a red micro light-emitting diode R1, a blue micro light-emitting diode B1, and a green micro light-emitting diode G1, and each second display pixel units P2 is composed of a red organic light-emitting diode R2, a blue organic light-emitting diode B2, and a green organic light-emitting diode. It can be understood that each of the first display pixel units P1 may further include a white micro light-emitting diode, and each of the second display pixel units P2 may further include a white organic light-emitting diode. The first display pixel units P1 and the second display pixel units P2 are both arranged in a sequence of red-green-blue (RGB).

It can be understood that each first display pixel units P1 adopts a standard RGB arrangement, and the second display pixel units P2 can adopt an RGB PenTile arrangement to adapt to the density of the second display pixel units P2 in the display area 100a is large and the density of the first display pixel units P1 in the transparent display area 100b is small, that is, the display performances of the display area 100a and the transparent display area 100b are ensured, and the space of the display area 100a and the transparent display area 100b is better utilized.

Figure 3:
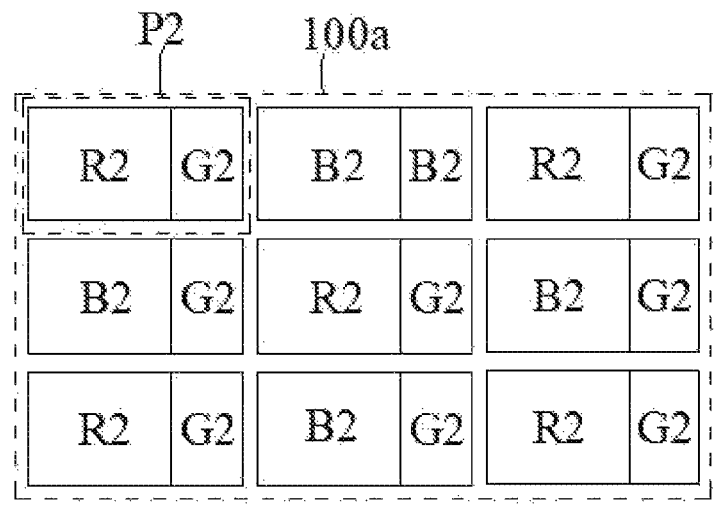
FIG. 3 is another partially enlarged schematic view showing a display area of the display panel of FIG. 1.

Specifically, as shown in FIG. 3, which is another partially enlarged schematic view showing a display area of the display panel of FIG. 1. A portion of the second display pixel unit P2 is composed of the red organic light-emitting diode R2 and the green organic light-emitting diode G2, and a remaining portion of second display pixel unit P2 is composed of the blue organic light-emitting diode B2 and the green organic light-emitting diode G2. The first display pixel unit P1 is composed of the red micro light-emitting diode tube R1, the blue micro light-emitting diode B1, and the green micro light-emitting diode G1.

Figure 4:
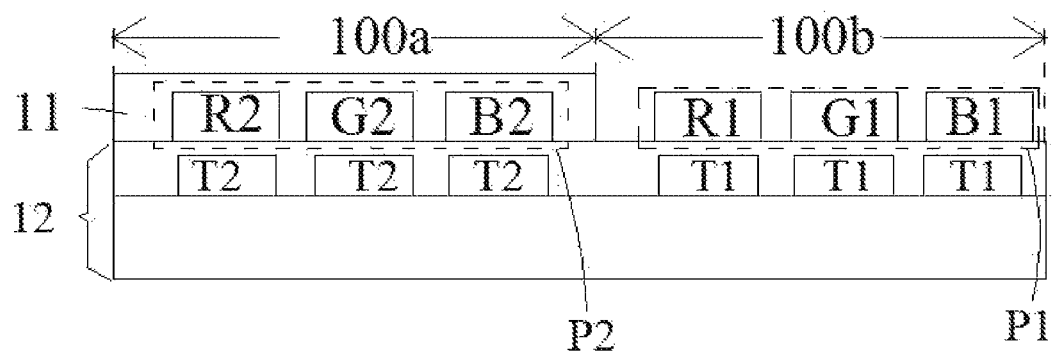
FIG. 4 is a schematic cross-sectional view along a line A-A of the display panel of FIG. 1.

Please refer to FIG. 4, which is a schematic cross-sectional view along a line A-A of the display panel of FIG. 1. The display panel 100 further includes an encapsulation layer 11 formed on the second display pixel units P2 of the display area 100a to encapsulate the second display pixel units P2, thereby preventing abnormally displaying of the display panel 100 due to the organic light-emitting layer in the second display pixel units P2 of the display area 100a are in contact with moisture and oxygen from the outside. The transparent display area 100b is free from the encapsulation layer 11 to ensure the light transmittance of the transparent display area 100b.

The display panel 100 further includes a thin film transistor array substrate 12. The transparent display area 100b of the thin film transistor array substrate 12 is provided with first thin film transistors T1. The display area 100 of the thin film transistor array substrate 12 is provided with second thin film transistors T2. The first display pixel units P1 are disposed on the thin film transistor array substrate 12 and are corresponding to the first thin film transistors T1. The second display pixel units P2 are disposed on the thin film transistor array substrate 12 and corresponding to the second thin film transistors T2. The first thin film transistors T1 are disposed and electrically connected to the micro light-emitting diodes. The second thin film transistors T2 are disposed corresponding and electrically connected to the organic light-emitting diodes and. Specifically, the first thin film transistors T1 are disposed in one-to-one correspondence with and electrically connected to the micro light-emitting diodes. The second thin film transistors T2 are disposed in one-to-one correspondence with and electrically connected to the organic light-emitting diodes. The first thin film transistor T1 is used to control an operation state of a sub-pixel of the first display pixel units P1. The second thin film transistor T2 is used to control an operation state of a sub-pixel of the second display pixel units P2.

The transparent display area 100b includes a first transparent display area (not shown) and a second transparent display area (not shown) to avoid a brightness between the display area 100a and the transparent display area 100b transiting smoothly if a brightness of the micro light-emitting diode and a brightness of the organic light-emitting diode are different. The first transparent display area is located between the display area 100a and the second transparent display area. The first transparent display area serves as a display brightness gradient area. Data voltages corresponding to the first thin film transistors T1 of the first transparent display area gradually change from near the display area 100a to near the second transparent display area. The brightness of the first transparent display area is equal to the brightness of the second transparent display area near the first transparent display area. When the second transparent display area is a circle, the first transparent display area is a ring. For example, when the brightness of the micro light-emitting diode is greater than the brightness of the organic light-emitting diode, the data voltages corresponding to the first thin film transistors of the second transparent display area gradually increase from the display area 100a to the second transparent display area. When the brightness of the micro light-emitting diode is smaller than the brightness of the organic light-emitting diode, the data voltages corresponding to the first thin film transistors T1 of the first transparent display area gradually decrease from the display area 100a to the second transparent display area, so as to avoid a boundary between the display area and the transparent display area being observed.

It can be understood that the display voltages of the first display pixel units P1 and the second display pixel units P2 can be adjusted, so that the brightness of the first display pixel unit P1 and the brightness of the second display pixel unit P2 are substantially the same to improve the uniformity of the display performance of the display panel.

Figure 5:
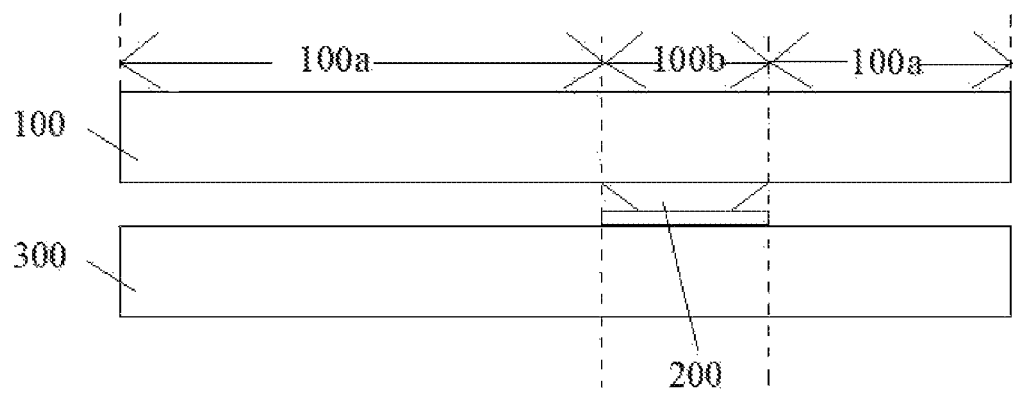
FIG. 5 is a schematic diagram of an electronic equipment according to an embodiment of the present disclosure.

Please refer to FIG. 5, which is a schematic diagram of an electronic equipment according to an embodiment of the present disclosure. The electronic equipment can be a smart mobile terminal, a tablet, etc. The electronic equipment includes the above display panel 100, a front-facing camera 200, and a mainboard 300. The mainboard 300 is electrically connected to the front-facing camera 200 and the display panel 100. The front-facing camera 200 is located on one side of the display panel 100 and corresponding to the transparent display area 100b. The mainboard 300 is located on a side of the front-facing camera 200 away from the display panel 100.

The electronic equipment of the present disclosure ensures that an ambient light can pass through the transparent area of the transparent display area and transmit into the front-facing camera by setting the micro organic light-emitting diodes in the transparent display area to make the transparent display area have high light transmittance and high display brightness, so that a technical problem of an inferior display performance of the electronic equipment is prevented.

The description about the embodiments of the present disclosures is merely provided to help understand the technical solutions and core ideas of the present disclosure. Those having ordinary skill in the art should understand that they still can modify technical solutions recited in the aforesaid embodiments or equivalently replace partial technical features therein. These modifications or substitutions do not make essence of corresponding technical solutions depart from the spirit and scope of technical solutions of embodiments of the present disclosure.

What is claimed is:

1. A display panel, comprising a display area and a transparent display area outside the display area, wherein the transparent display area comprises at least one first display pixel unit which comprises at least one micro light-emitting diode;
    wherein the display area comprises a plurality of second display pixel units which are arranged in an array, and each of the second display pixel units comprises an organic light-emitting diode;
    wherein the transparent display area comprises a plurality of first display pixel units, and a density of the second display pixel units in the display area is greater than a density of the first display pixel units in the transparent display area; and
    wherein each of the first display pixel units is composed of a red micro light-emitting diode, a blue micro light-emitting diode, and a green micro light-emitting diode, and each of the second display pixel units is composed of a red organic light-emitting diode, a blue organic light-emitting diode, and a green organic light-emitting diode.

2. The display panel as claimed in claim 1, wherein a distance between any two adjacent first display pixel units is greater than a distance between any two adjacent second display pixel units.

3. The display panel as claimed in claim 1, further comprising an encapsulation layer formed on the second display pixel units of the display area to encapsulate the second display pixel units.

4. The display panel as claimed in claim 1, further comprising a thin film transistor array substrate, wherein the thin film transistor array substrate comprises a first thin film transistor in the transparent display area, and the thin film transistor array substrate comprises a second thin film transistor in the display area, the first thin film transistor is correspondingly disposed and electrically connected to the micro light-emitting diode, and the second thin film transistor is correspondingly disposed and electrically connected to the organic light-emitting diode.

5. The display panel as claimed in claim 1, wherein a size of the first display pixel unit is less than or equal to a size of the second display pixel unit.

6. The display panel as claimed in claim 1, wherein a ratio of an area occupied by the first display pixel units in the transparent display area to an area of the transparent display area ranges from 2/5 to 3/5.

7. An electronic equipment, comprising a display panel, a front-facing camera, and a mainboard, wherein the mainboard is electrically connected to the front-facing camera and the display panel, the front-facing camera is located at one side of the display panel and corresponds to a transparent display area, and the mainboard is located at a side of the front-facing camera away from the display panel, the display panel comprises a display area and the transparent display area outside the display area, and the transparent display area comprises at least one first display pixel unit which comprises at least one micro light-emitting diode.

8. The electronic equipment as claimed in claim 7, wherein the display area comprises a plurality of second display pixel units which are arranged in an array, and each of the second display pixel units comprises an organic light-emitting diode.

9. The electronic equipment as claimed in claim 8, wherein the transparent display area comprises a plurality of first display pixel units, and a density of the second display pixel units in the display area is greater than a density of the first display pixel units in the transparent display area.

10. The electronic equipment as claimed in claim 9, wherein each of the first display pixel units is composed of a red micro light-emitting diode, a blue micro light-emitting diode, and a green micro light-emitting diode, and each of the second display pixel units is composed of a red organic light-emitting diode, a blue organic light-emitting diode, and a green organic light-emitting diode.

11. The electronic equipment as claimed in claim 9, wherein a distance between any two adjacent first display pixel units is greater than a distance between any two adjacent second display pixel units.

12. The electronic equipment as claimed in claim 8, wherein the display panel further comprises an encapsulation layer formed on the second display pixel units of the display area to encapsulate the second display pixel units.

13. The electronic equipment as claimed in claim 8, wherein the display panel further comprises a thin film transistor array substrate, wherein the thin film transistor array substrate comprises a first thin film transistor in the transparent display area, and the thin film transistor array substrate comprises a second thin film transistor in the display area, the first thin film transistor is correspondingly disposed and electrically connected to the micro light-emitting diode, and the second thin film transistor is correspondingly disposed and electrically connected to the organic light-emitting diode.

14. The electronic equipment as claimed in claim 8, wherein a size of the first display pixel unit is less than or equal to a size of the second display pixel unit.

15. The electronic equipment as claimed in claim 7, wherein a ratio of an area occupied by the first display pixel units in the transparent display area to an area of the transparent display area ranges from 2/5 to 3/5.

* * * * *